United States Patent [19]

Stanley

[11] Patent Number: 4,611,180

[45] Date of Patent: Sep. 9, 1986

[54] GROUNDED BRIDGE AMPLIFIER PROTECTION THROUGH TRANSISTOR THERMO PROTECTION

[75] Inventor: Gerald R. Stanley, Mishawaka, Ind.

[73] Assignee: Crown International, Inc., Elkhart, Ind.

[21] Appl. No.: 689,916

[22] Filed: Jan. 9, 1985

[51] Int. Cl.⁴ .......................... H03F 3/26; H02H 5/04
[52] U.S. Cl. .................................... 330/298; 330/146; 330/207 P; 361/103
[58] Field of Search ...................... 330/146, 207 P, 51, 330/298; 361/79, 103

[56] References Cited

U.S. PATENT DOCUMENTS 3,808,545  4/1974  Stanley ........................... 330/298 X
4,330,809  5/1982  Stanley ................................ 361/103

Primary Examiner—James B. Mullins
Attorney, Agent, or Firm—James D. Hall

[57] ABSTRACT

A bridge amplifier having paired high and low output stages in which a main amplifier receiving an input signal drives the high output stages and a balancing amplifier drives the low of the output stages. A junction temperature simulation circuit extends between the main amplifier and the low output stages in which the temperatures of the low output stages are sensed to produce an arresting of the main amplifier drive to the high output stages and thereby simultaneously control the balancing amplifier and its drive to the low output stages.

4 Claims, 3 Drawing Figures

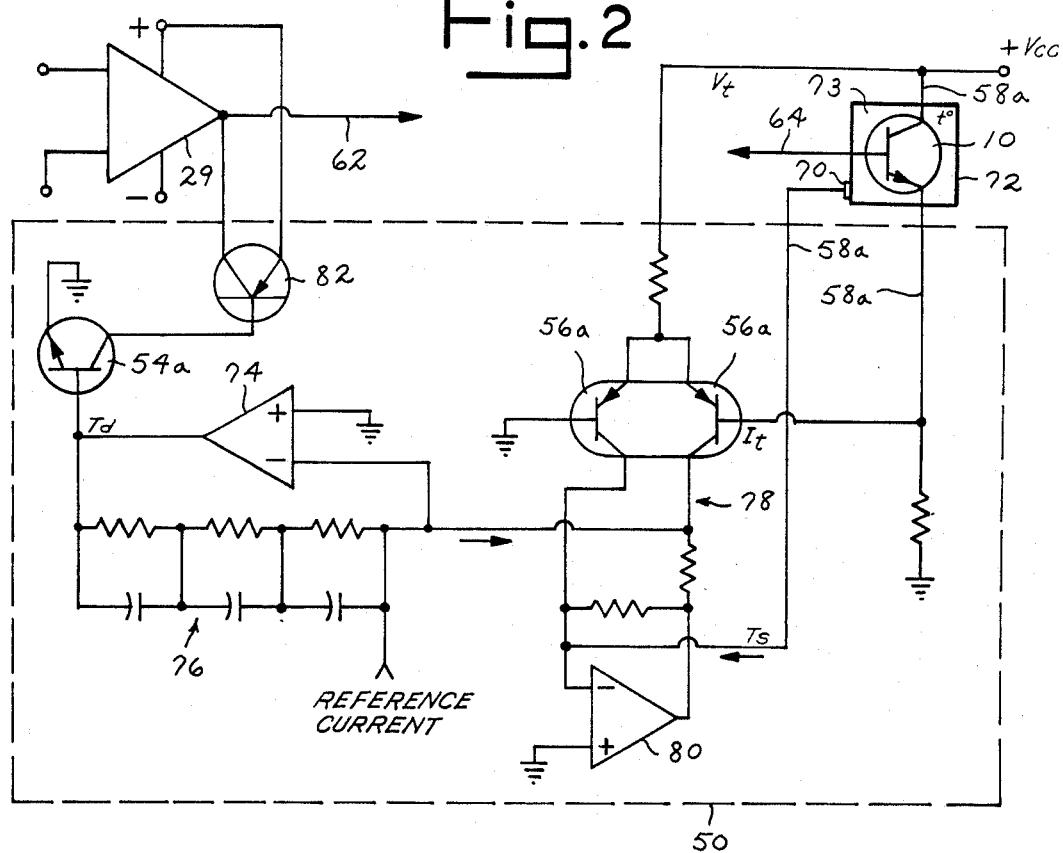
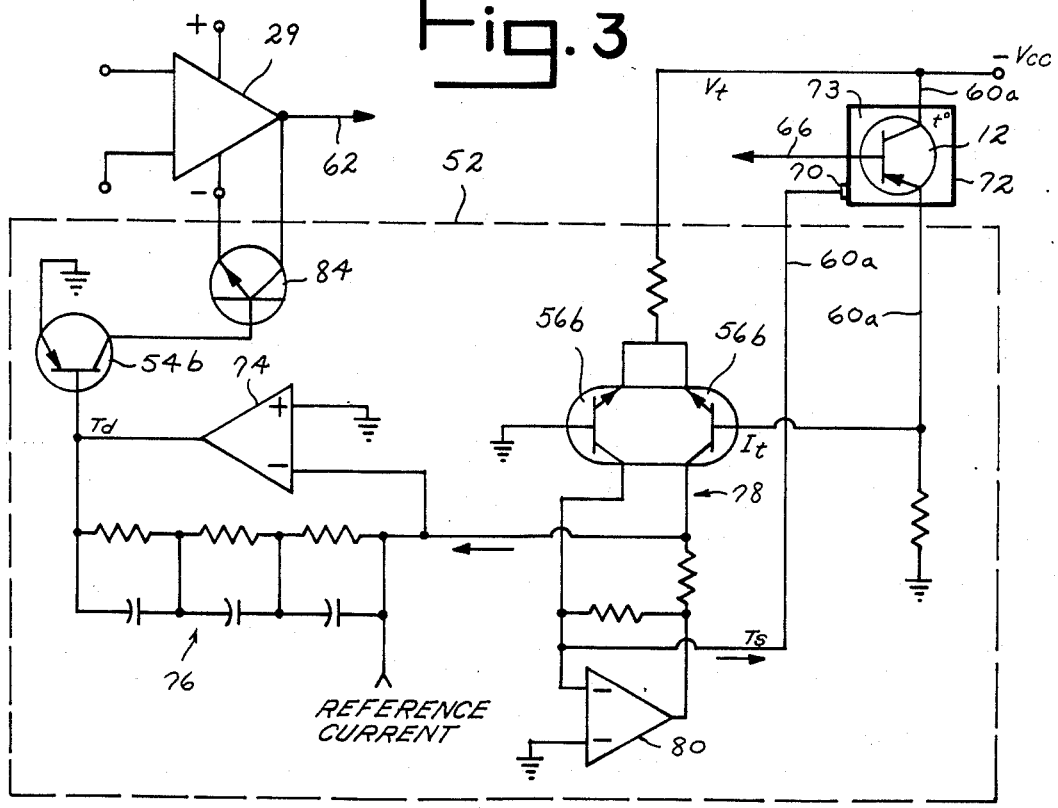

GROUNDED BRIDGE AMPLIFIER PROTECTION THROUGH TRANSISTOR THERMO PROTECTION

SUMMARY OF THE INVENTION

This invention relates to the incorporation of a protection circuit into bridge amplifiers and will have specific but not necessarily limited application to grounded bridge amplifiers protected by junction temperature simulation.

The protection of bridge amplifiers having four amplifier sections or output stages connected in a bridge is discussed in U.S. Pat. No. 3,808,545. In U.S. Pat. No. 3,808,545, as well as in this invention, a condition of one pair of output stages is sensed to control the output of the drive amplifier to the other pair of output stages, which in turn causes a balancing effect in the drive of the second drive amplifier to the first mentioned sensed pair of output stages.

In this invention, the applied power to each of the output stages of one pair of output stages, preferably on the low side of the bridge, is sensed to determine a sensed temperature of each output stage. This sensed temperature is monitored and when a predetermined maximum is reached, the applied power to the drive amplifier to the other pair of output stages, preferably the high side of the bridge, is reduced. This reduction in drive to the other output stages reduces the drive to the other or balancing drive amplifier which drives the sensed pair of output stages so as to produce a balance power reduction in the bridge circuit. In U.S. Pat. No. 4,330,809 such a thermo protection circuit is disclosed for the die of a transistor. This protection circuit is uniquely incorporated into the bridge amplifier of the type shown in FIG. 2 of U.S. Pat. No. 3,808,545 to produce an effective cost efficient protection circuit for the bridge amplifier.

Accordingly, it is an object of this invention to provide a protection circuit for a bridge amplifier.

Another object of this invention is to provide for the protection of grounded bridge amplifiers by thermo protection.

Another object of this invention is to provide a protection circuit in combination with a bridge amplifier which is efficient and cost effective.

Still another object of this invention is to provide a temperature simulated protection for a bridge amplifier in which the sensed temperature of the low side of the amplifier bridge regulates the drive to the high side of the bridge.

Other objects of this invention will become apparent upon a reading of the following description.

BRIEF DESCRIPTION OF THE DRAWINGS

FIG. 2 is a circuit diagram of the protection circuit to one output stage at the low side of the bridge.

FIG. 3 is a circut diagram of the protection circuit to the other output stage at the low side of the bridge.

DESCRIPTION OF THE INVENTION

Figure 1:
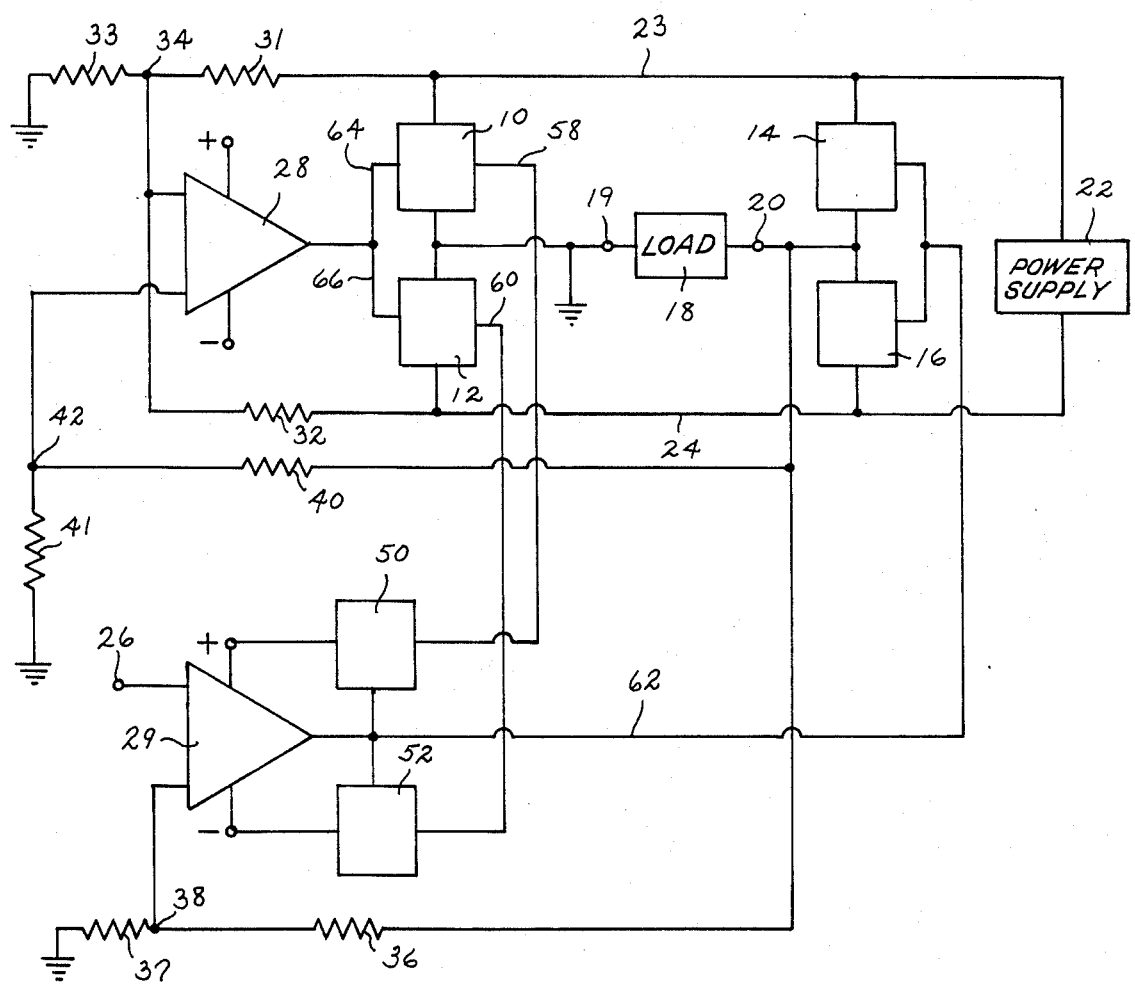
FIG. 1 is a block diagram of a bridge amplifier having the protection circuit of this invention.

In the block diagram of the bridge amplifier shown in FIG. 1 the position and function of the components with the exception of protection controls 50 and 52, are the same in type and manner of operation as those components shown in FIG. 2 of commonly owned U.S. Pat. No. 3,808,545, incorporated herein by reference. This bridge amplifier includes power amplifier sections or output stages 10, 12, 14 and 16 for driving load 18. Load 18 has one terminal 19 which is grounded and a second terminal 20 which is at the signal output potential. A power supply 22 is connected by conductors 23,24 to output stages 10, 12, 14 and 16 to form the bridge. Power supply 22 provides a positive potential on conductor 23 and a negative potential on conductor 24 and is floating with respect to ground. An input signal is applied to terminal 26 of drive amplifier 29 whose output drives output stages 14,16 at the high side of the bridge. Resistors 36,37 form a feedback circuit to drive amplifier 29 at its terminal 38. A second drive amplifier 28 drives the remaining pair of output stages 10,12 which form the low side of the bridge. The output of paired output stages 14,16 at the high side of the bridge is applied through resistors 40,41 to terminal 42 of drive amplifier 28. Resistors 31,32 and 33 provide a potential at input 34 of drive amplifier 28. Drive amplifer 29 serves as the main drive with drive amplifier 28 serving the balancing drive for the bridge. The manner of operation of a bridge amplifier of the aforedescribed nature is well known and is fully disclosed in U.S. Pat. No. 3,808,545 in which the components of the amplifier are similarly numered and function similarly.

FIGS. 2 and 3 are circuit diagrams of the thermo protection circuit showing its association with drive amplifier 29 and output stages 10,12. In FIG. 2, the multiple transistors forming the NPN output stage 10 is designated and shown as a single composite transistor 10. In FIG. 3, the multiple transistors forming the PNP output stage 12 is designated and shown as a single composite transistor 12. Composite transistors 10,12 will hereinafter be referred to simply as output stages 10 and 12, respectively. In FIG. 2, that part of the thermo protection circuit shown within the broken line box is representative of the control 50 shown in FIG. 1. Also with regard to FIG. 3, that portion of the thermo protection circuit shown in the broken line box is representative of the control 52 shown in FIG. 1.

In FIGS. 2 and 3, thermo protection circuits 50 and 52 are shown, for illustrative purposes, separately connected to drive amplifier 29. It is to be understood that in actual practice of the invention, both protection circuts 50,52 would be connected to the same drive amplifier 29 with circuit 50 connected to the positive input terminal and output of the amplifier and with circuit 52 being connected to the negative input terminal and output of the amplfier. With the exception of added PNP transistor 82 in FIG. 2 and added NPN transistor 84 in FIG. 3, the general circuitry within the broken line box in each of the figures including the composite transistor is the same as shown and described in commonly owned U.S. Pat. No. 4,330,809, incorporated herein by reference, at its FIG. 3. In FIG. 3 of this invention, the protection circuit is like that of the protection circuit of FIG. 2 of this invention and as disclosed in U.S. Pat. No. 4,330,809 with the exception that transistor 54b is a PNP type as distinguished from the NPN type of the corresponding transistor 54a in FIG. 2 and transistors 56b are of the NPN type as distinguished from the PNP type transistors 56a found in FIG. 2 to accomodate the PNP output stage 12 as distinguished from the NPN output stage 10 of the bridge amplifier. Otherwise the function and operation of the protection circuit 52 of FIG. 3 is like that of the protection circuit 50 in FIG. 2. Conductor 58 in FIG. 1 is representative in composite form of the three conductors 58a shown in FIG. 2. Conductor 60 in FIG. 1 is representative in composite form of the three conductors 60a in FIG. 3. Conductor 62 at the output of drive amplifier 29 is similarly numbered in FIGS. 2 and 3. Conductor 64 from drive amplifier 28 into output stage 10 and conductor 66 from the same drive amplifier to output stage 12 are respectively similarly numbered in FIGS. 2 and 3.

The operation of protection circuits 50,52 while are more particularly described in U.S. Pat. No. 4,330,809, is as follows. A temperature sensitive integrated circuit 70 senses the temperature of the heat sink 72 of each of the composite transistors 10,12 representative of the low side output stages of the bridge amplifier. Each IC70 has a current output or signal Ts which is proportionate to the heat sink temperature. Signal Ts is combined with a signal Tds through amplifiers 74, 80 and feed back network 76. Each signal Tds is a voltage representative of the simulated temperature differential between the die 73 and heat sink 72 of each composite transistor 10,12. Feedback network 76, which is a series of resistors, each connected in parallel with a capacitor, in conjunction with amplifier 74 takes a signal VtIt from the output of a multiplier 78 and converts it into a voltage representative of the signal Tds. Multiplier 78 is of the two-quadrant transconductance type which includes a pair of bipolar transistors as 56a or 56b in FIGS. 2 and 3 as the case may be. A current representative of signal Vt is received at the emitters of transistors 56a, 56b and a voltage representative of It is received at the base of one transistor 56a, 56b. These signals are converted by multiplier 78 into a single-ended output current, a signal representative of the product VtIt by operational amplifier 80. Signal Ts is combined with signal Tds to produce an output signal Td of amplifier 74. Signal Td is proportional to the sensed transistor die temperature. Signal VtIt is representative of the applied power to a composite transistor or output stage.

Output signal Td from amplifier 74 is received by limiting transistor 54a or 54b in FIGS. 2 and 3 as the case may be, and serves the functional purpose of a temperature comparator. When the forward bias of transistor 54a, 54b is reached upon receipt of signal Td, the transistor is turned on. Transistors 54a and 54b are designed to turn on when signal Td is representative of a maximum allowed die temperature for the input stages. The turn on of transistor 54a, 54b in turn turns on transistor 82 in FIG. 2 or transistor 84 in FIG. 3 depending upon which monitored output stage 10 or 12 of the bridge amplifier reaches its maximum allowed die temperature. The turn on of either transistor 82 or 84 shunts connected drive amplifier 29 to reduce the drive respectively to input stages 16 or 14. This drive reduction to high side input stages 16 or 14 causes a corresponding balanced reduction of power to stages 10 or 12 through the reduction in drive from amplifier 28 as previously described. As to which input stage 14,16 has its drive initially arrested by operation of amplifier 29 depends upon which protection circuit 50 and 52 causes the shunting of the drive amplifier. In this manner, the bridge amplifier is limited to prevent amplifier damage.

It is to be understood in the above described concept, the low side of the bridge is sensed for protecting the high side of the bridge. If desired, the protection circuits can be modified to sense the temperature of the high stages 14 and 16 of the bridge but the large signal voltages involved will increase the cost of the protection system as well as making probing and testing of the system somewhat more hazardous. By constructing the protection systems as shown in the described embodiment common to ground, such probing and testing hazards are eliminated.

The above invention is not to be limited to the details above described but may be modified within the scope of the appended claims.

I claim:

1. In a bridge amplifier having a protection circuit, said bridge amplifier including a first paired output stage and second paired output stage, means for connecting a load between said first and second paired output stages, means for connecting a power supply to said first and second paired output stages to form a bridge circuit, first and second drive amplifiers, said first drive amplifier coupled to said first paired output stage, said second drive amplifier coupled to said second paired output stage, said first drive amplifier for receiving an input signal to drive said first paired output stage, said second drive amplifier for receiving an input signal responsive to the driven output of said first paired output stage to cause said second paired output stage to act in a balancing manner, the improvement comprising means for sensing an operating temperature of each output stage of one of said first and second paired output stages, and means in response to selected maximum of each sensed operating temperature for reducing the drive output of said first drive amplifier.

2. The bridge amplifier and protection circuit of claim 1 wherein said means for sensing the operating temperature of each output stage of said one paired output stage senses the applied power to such stages and determines a sensed temperature of the stages.

3. The bridge amplifer and protection circuit of claim 2 wherein said one paired output stage is said second paired output stage.

4. The bridge amplifier and protection circuit of claim 3 wherein said second paired output stage is at a low side of the bridge.

* * * * *